United States Patent [19]

Cooper

[11] Patent Number: 5,790,671

[45] Date of Patent: Aug. 4, 1998

[54] METHOD FOR AUTOMATICALLY ADJUSTING AUDIO RESPONSE FOR IMPROVED INTELLIGIBILITY

[75] Inventor: Gerald M. Cooper, Gretna, Va.

[73] Assignee: Ericsson Inc., Research Triangle Park, N.C.

[21] Appl. No.: 626,908

[22] Filed: Apr. 4, 1996

[51] Int. Cl.⁶ .................................................. H03G 3/20
[52] U.S. Cl. .............................. 381/57; 381/103; 381/107
[58] Field of Search .............................. 381/57, 98, 101, 381/102, 103, 107, 108

[56] References Cited

U.S. PATENT DOCUMENTS

| | | | |
|---|---|---|---|
| 4,454,609 | 6/1984 | Kates | 381/68 |
| 4,790,018 | 12/1988 | Preves et al. | 381/68.4 |
| 4,868,881 | 9/1989 | Zwicker et al. | 381/57 |
| 4,941,179 | 7/1990 | Bergenstoff et al. | 381/68.4 |
| 5,138,665 | 8/1992 | Ito | 38/102 |
| 5,172,417 | 12/1992 | Iwamura | 381/103 |
| 5,450,494 | 9/1995 | Okubo et al. | |
| 5,459,813 | 10/1995 | Klayman | |
| 5,509,081 | 4/1996 | Kuusama | 381/103 |

FOREIGN PATENT DOCUMENTS

| | | |
|---|---|---|
| 0578008 | 1/1994 | European Pat. Off. |
| 0669711 | 8/1995 | European Pat. Off. |

OTHER PUBLICATIONS

*Electronic Communications*, Second Edition, Dennis Roddy and John Coolen, Authors, Lakehead University, Thunder Bay, Ontario, Canada, pp.84–86.

Primary Examiner—Forester W. Isen
Attorney, Agent, or Firm—Nixon & Vanderhye PC

[57] ABSTRACT

Intelligibility of received speech in a radio receiver is improved by automatically adjusting audio response in accordance with ambient noise levels. When high ambient noise is present, the relative gain of the higher audio frequencies is increased at the expense of low frequency response. In this instance, some "naturalness" is traded for the higher intelligibility provided by increased high frequency gain. The ambient noise level is determined based on either a volume level or a direct sample of ambient noise by a microphone. An audio response message is built in accordance with the ambient noise level, and a digital signal processor adjusts the audio response of the radio receiver in accordance with the audio response message.

21 Claims, 4 Drawing Sheets

METHOD FOR AUTOMATICALLY ADJUSTING AUDIO RESPONSE FOR IMPROVED INTELLIGIBILITY

BACKGROUND

The present invention relates generally to radio receivers and, more particularly, to an apparatus and method for dynamically altering the audio response of a radio receiver to improve intelligibility of received speech.

Mobile and portable radios are often used in areas with high ambient noise which degrades the intelligibility of transmitted and received messages. The use of noise canceling microphones addresses the issue of impaired transmissions, but there is little a user can do to overcome ambient noise while receiving the audio signals except to increase the received volume or wear a headset.

Both of these approaches have limited usefulness. That is, there is a limit to the total audio energy the radio is capable of producing without severe distortion, especially with portable receivers. In addition, increasing the volume adds to the pre-existing high ambient noise level, which could result in other noise sources increasing their volume, thereby further aggravating the problem. Headsets pose problems with comfort, and the attenuation of ambient noise may cause safety problems for the wearer.

Some manufacturers of consumer audio equipment have included a "loudness" control in their audio receivers. While this does select between preset audio response curves, it is a manual operation left to the user.

SUMMARY OF THE INVENTION

It is therefore an object of the present invention to provide a method and apparatus wherein an audio response is automatically adjusted to improve intelligibility in areas with high ambient noise, thereby overcoming the problems of the prior art. It is another object of the invention to provide a method and apparatus for dynamically altering the audio response of a radio receiver to yield the best tradeoff between "naturalness" and intelligibility of received speech.

"Naturalness" conceptually refers to the natural frequencies of generated sound. In this regard, a "natural" audio response includes no enhancement of any frequencies so that the outputted signal response more closely corresponds to the input signal.

In general, a basic concept of the invention is to increase the relative gain of the higher audio frequencies at the expense of low frequency response to improve intelligibility when there is high ambient noise. The decision on when to boost the high frequency gain can be based on sampled ambient noise or on the user's choice of received volume setting. (In the latter case, a high setting would be taken as an indicator that ambient noise is also high.) Under high ambient noise levels, some "naturalness" is traded for the higher intelligibility provided by increased high frequency gain.

These and other objects of the invention are achieved by providing a method of dynamically altering an audio response of a radio receiver. The method includes (a) determining an ambient noise level; (b) determining an audio response function in accordance with the ambient noise level; and (c) adjusting the audio response of the radio receiver in accordance with the audio response function. Step (b) may be practiced by building an audio response message for a digital signal processor (DSP) or by modifying a response of a dedicated filter circuit.

In preferred forms, step (a) may be practiced by detecting a volume knob position or by sampling the ambient noise level using a microphone input. In each instance, step (b) is preferably practiced by accessing an array of audio parameters and selecting parameters corresponding to the volume knob position or the sampled ambient noise level, respectively.

The method may further include dividing a receive audio passband into at least low frequency and high frequency sub bands to define an array of audio parameters corresponding to each volume knob position or a range of ambient noise levels. In this regard, step (b) is preferably practiced by accessing the array of audio parameters and selecting parameters corresponding to the volume knob position or sampled ambient noise level.

Step (c) may be practiced by (d) adjusting a gain of high audio frequencies relative to low audio frequencies, and when the ambient noise level increases, step (d) is preferably practiced by increasing the gain of the high audio frequencies relative to the low audio frequencies.

Prior to step (c), the method may further include sending the audio response message to a DSP, wherein step (c) is carried out by the DSP. Further, the method may include, also prior to step (c), extracting audio response parameters from the audio response message and substituting the audio response parameters into a DSP filter routine.

In accordance with another aspect of the invention, there is provided another method of dynamically altering an audio response of a radio receiver. This method includes (a) determining an ambient noise level; and (b) adjusting a gain of high audio frequencies relative to low audio frequencies in accordance with the ambient noise level. In this regard, when the ambient noise level increases, step (b) is practiced by increasing the gain of the high audio frequencies relative to the low audio frequencies.

In accordance with still another aspect of the invention, there is provided an apparatus for dynamically altering an audio response of a radio receiver, which carries out the method according to the invention. The apparatus includes structure for determining an ambient noise level; a controller that builds an audio response message in accordance with the ambient noise level; and a digital signal processor (DSP) that adjusts the audio response of the radio receiver in accordance with the audio response message.

In accordance with yet another aspect of the invention, there is provided another apparatus for dynamically altering an audio response of a radio receiver. The apparatus includes structure for determining an ambient noise level; and structure for adjusting a gain of high audio frequencies relative to low audio frequencies in accordance with the ambient noise level. The adjusting structure preferably increases the gain of the high audio frequencies relative to the low audio frequencies when the ambient noise level increases.

By virtue of the present invention, no adjustment is required by the operator, especially when controlled by sampling ambient noise directly. Moreover, the "naturalness" of received speech is only compromised when necessary to enhance intelligibility, thus received audio will be unaltered during normal ambient noise conditions. Still further, by limiting the energy of the low frequencies, the volume of the high frequencies can be raised substantially beyond the point where distortion would normally limit usable volume.

BRIEF DESCRIPTION OF THE DRAWINGS

These and other aspects and advantages of the invention will become more clear in view of the following detailed description of the preferred embodiments when read in conjunction with the accompanying drawings in which.

DETAILED DESCRIPTION OF PREFERRED EMBODIMENTS

Figure 1:
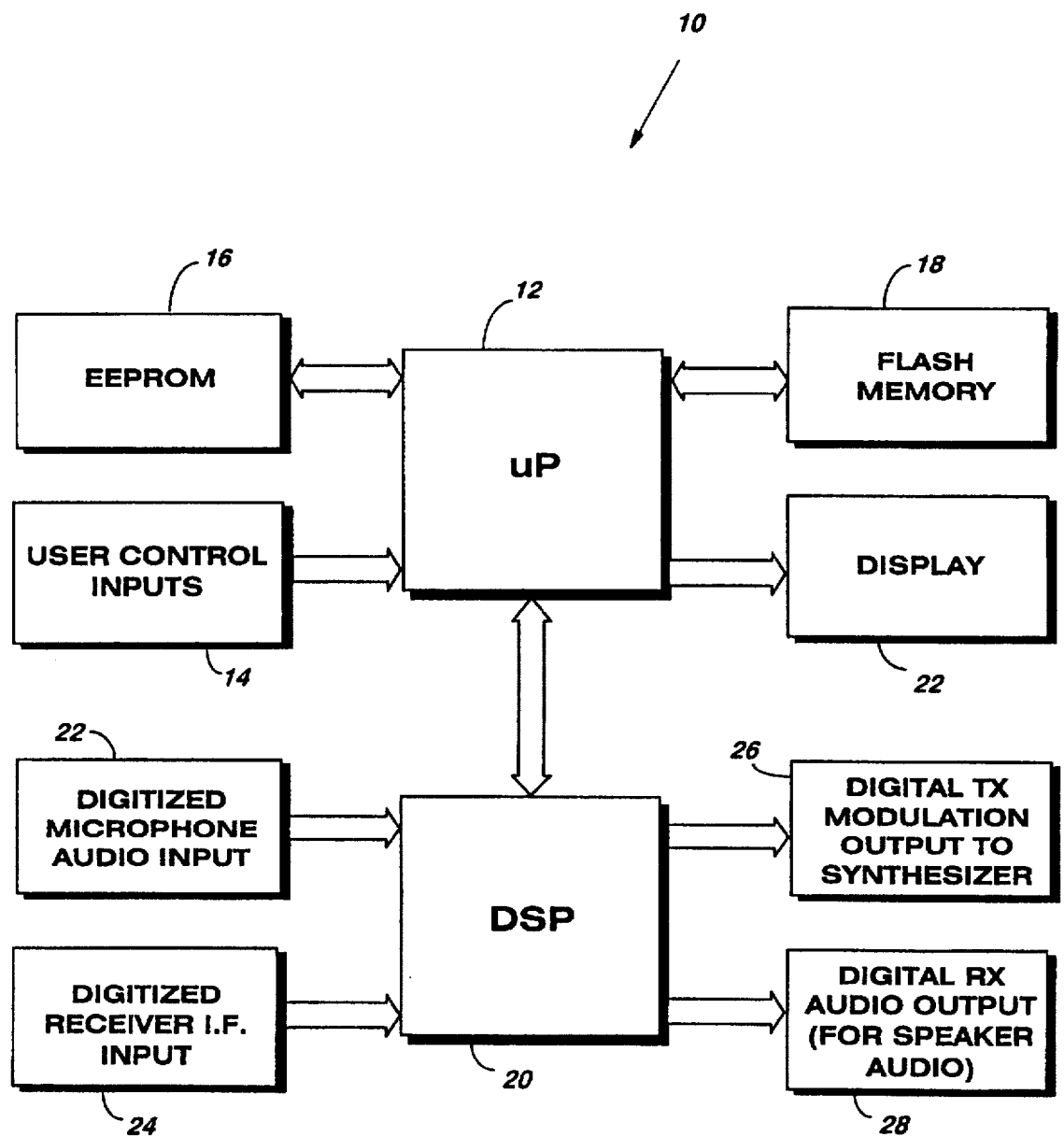
FIG. 1 is a block diagram showing the hardware configuration of a portable radio.

FIG. 1 is a block diagram showing the hardware configuration of a portable radio such as the Ericsson Prism (HP) portable radio manufactured and sold by Ericsson, Inc. of Lynchburg, Virginia. Those of ordinary skill in the art will contemplate other structural configurations to carry out the method according to the invention, and the invention is not meant to be limited to the illustrated portable radio. The structure illustrated in FIG. 1 is merely one example of a hardware configuration that is compatible with the features of the present invention.

Referring to FIG. 1, the portable radio 10 includes a microprocessor 12, which serves as the primary controller for the radio. The microprocessor 12 monitors inputs provided from the user control inputs 14. The user control inputs 14 encompasses user controls such as PTT, volume control and the channel selector. An EEPROM 16 holds information that personalizes the product to the user's needs. This information can include the operating frequencies, group ID's, operator preferences and the like. A flash memory 18 also communicates with the microprocessor 12 and stores program information for the microprocessor and personality information similar to that held in the EEPROM. The flash memory may also contain operational software to be downloaded to the digital signal processor (DSP) 20 (described below). The display 22 is typically an LCD indicator used to display current selections and radio status.

The DSP 20 is responsible for all audio processing and assumes part of the role of the modem. The demodulator function is provided by the DSP 20, and all audio filtering is done with the DSP 20. A digitized microphone audio input 22 communicates with the DSP 20, wherein the microphone audio has already been digitized by a CODEC or equivalent. A digitized receiver I.F. input 24 also communicates with the DSP, wherein the receiver intermediate frequency signal is fed to a phase digitizer and then sampled directly by the DSP 20. A digitized TX modulation output to synthesizer is the transmit audio, which is routed to the transmitter synthesizer in digital form. In this particular configuration, conversion to analog audio is not necessary. Finally, a digital RX audio output 28 (for speaker audio) is also provided, which is the digital audio destined for the speaker. It is converted to analog audio by an external CODEC prior to being fed to an audio power amplifier (not shown).

The detailed structure of the portable radio is well known to those of ordinary skill in the art, and the details of the structure illustrated in FIG. 1 will therefore not be further described.

Figure 2:
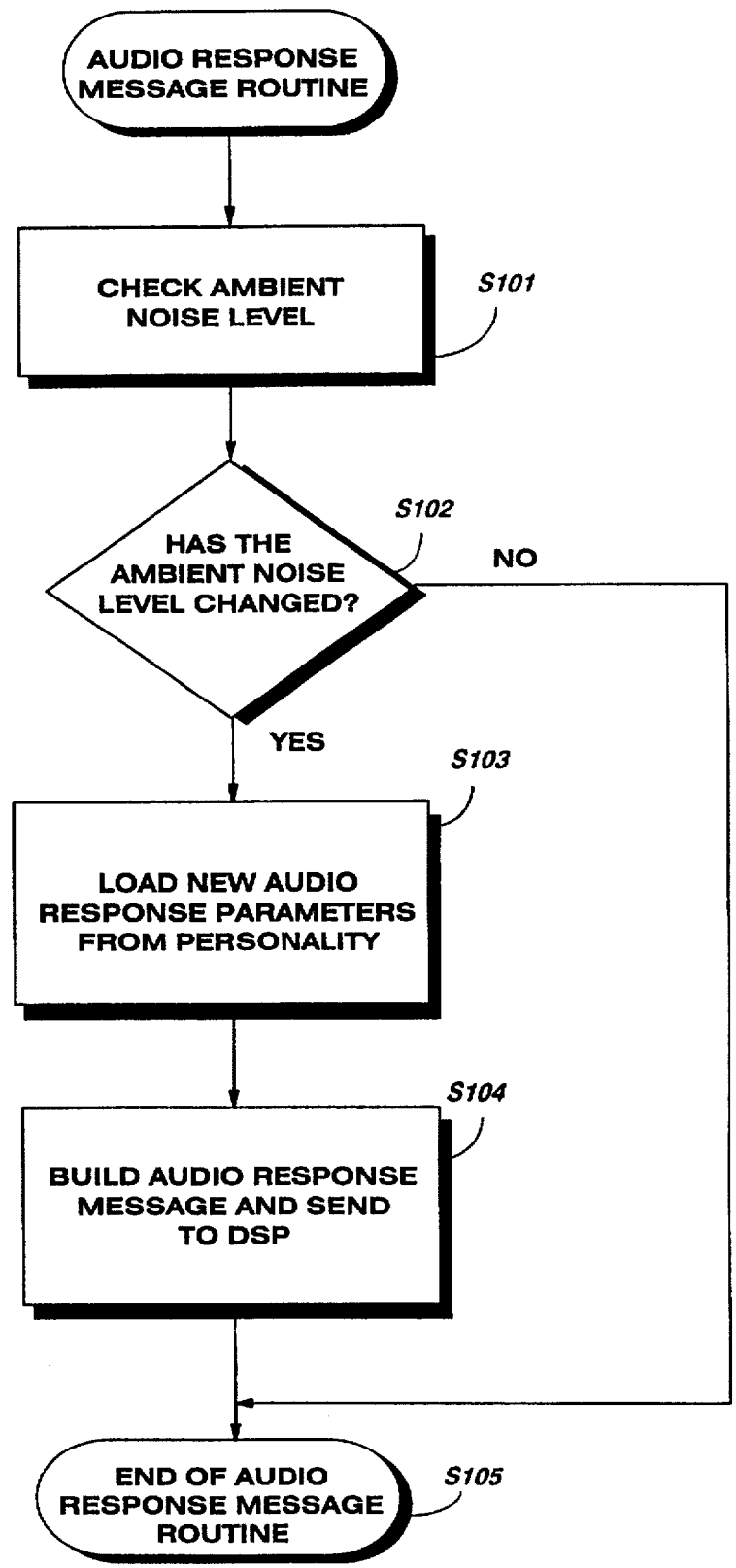
FIG. 2 is a flow chart of the control microprocessor implementation according to the invention.
Figure 4:
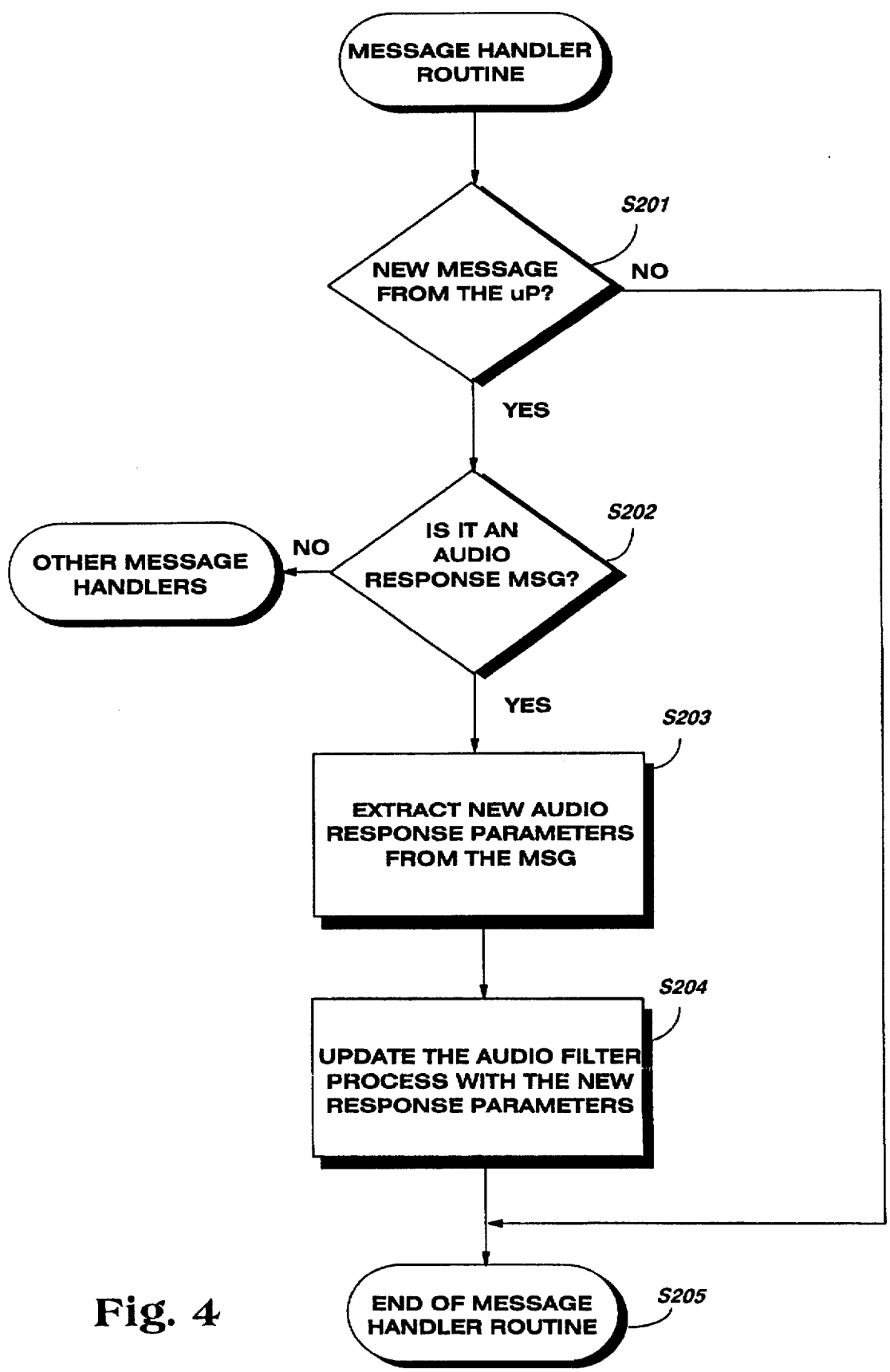
FIG. 4 is a flow chart of the digital signal processor (DSP) implementation according to the invention.

FIGS. 2 and 4 illustrate the process performed by the microprocessor 12 of the portable radio 10. FIG. 2 illustrates the process executed as part of the background task performed periodically by the microprocessor 12. During this background task, the microprocessor examines the input controls to detect user activity, such as button presses and knobs being turned, and determines a level of ambient noise for determining an audio response function. With the DSP 20, the audio response function is determined by building a corresponding audio response message. As an alternative to the DSP 20, a dedicated analog filter circuit (not shown) may be provided. In this regard, the audio response function would be determined by modifying a response of the dedicated filter circuit.

In accordance with the present invention, the ambient noise level is first examined in step S101. If the ambient noise level is found not to have changed at all or not enough to constitute a change (no in step S102), then the microprocessor 12 skips ahead to step S105, and no action is taken. However, if a new ambient noise level is detected (yes in step S102), the microprocessor fetches audio parameters for the new level from the personality storage (either EEPROM or flash memory) (step S103). In step S104, these parameters are assembled into a message, which is then sent to the DSP 20.

The ambient noise level checked in step S101 is determined in accordance with either the volume setting (determined by the position of the volume knob) or a direct sampling of ambient noise using the digitized microphone audio input 22. With respect to determining the volume setting, it is assumed that a high volume setting is indicative of a high ambient noise level. The microprocessor accesses an audio parameter table including the audio parameters stored in the EEPROM 16 and/or flash memory 18 in accordance with the volume setting or the sampled ambient noise level.

Figure 3:
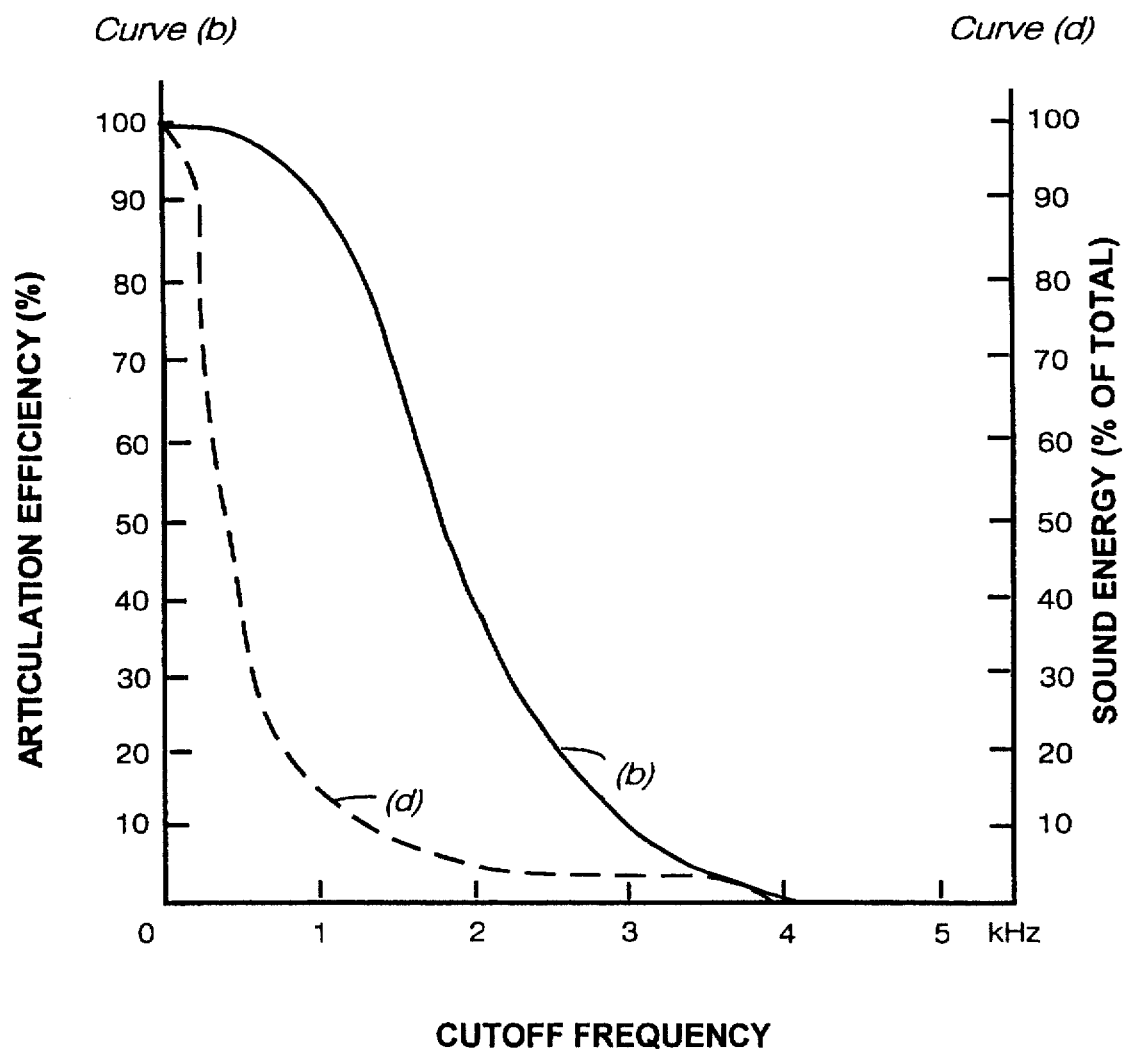
FIG. 3 is a graph illustrating electronic communication concepts according to the present invention.

The definition of the audio parameter table is derived from fundamental electronic communication concepts. FIG. 3 illustrates important concepts according to the present invention. Curve "b" demonstrates the effect on articulation efficiency caused by setting the lower cutoff frequency at various points. Typical mobile radio systems use a lower cutoff frequency of 300 hz, which yields an articulation efficiency of nearly 100%. Curve "b" shows that raising this lower cutoff frequency to as high as 1000 hz causes only a small decrease in articulation efficiency, to 90%. Curve "d" shows the total sound energy as a function of lower cutoff frequency. It can be seen that moving the lower cutoff frequency up to 1000 hz causes a major reduction in the total sound energy. As noted above, curve "b" provides that this can be accomplished with minimal effect on articulation efficiency.

Raising the cutoff frequency thus lowers the contribution to total energy caused by the lower frequency speech components, while having a small effect on articulation efficiency. The advantage is that the reduction in energy allows greater amplification to be applied to the higher frequencies, which convey most of the intelligence of human speech. The trade off is the "naturalness" of the speech. Since uneven amplification is applied to various bands of audio frequencies, there is a loss of fidelity of the speaker's voice.

A possible data structure for the audio parameters is shown below. In this arrangement, there is an array that contains a row for each possible volume setting. If the ambient noise level is determined using a direct sampling of ambient noise, a similar array would be accessed containing a row for each of a selected range of ambient noise levels. (For ease of discussion in this example, it is assumed that the volume is adjustable over eight steps. A radio would typically have 32 or more selectable levels.) Each row contains a boost/buck (positive/negative gain) setting for each sub band of the receive audio. In this example, the receive audio pass band is divided into low frequency, mid frequency, and high frequency sub bands. The boost/buck value indicates the gain relative to the default audio response curve. With this set of data, mid and high frequencies would receive relative boosts at volume settings of 5 and greater, and low frequency gain will be reduced.

| VOLUME SETTING | LOW FREQUENCY | MID FREQUENCY | HIGH FREQUENCY |
|---|---|---|---|
| 1 | 0 | 0 | 0 |
| 2 | 0 | 0 | 0 |
| 3 | 0 | 0 | 0 |
| 4 | 0 | 0 | 0 |
| 5 | −1 | 0 | +1 |
| 6 | −2 | 0 | +2 |
| 7 | −3 | −1 | +3 |
| 8 | −4 | −2 | +3 |

Note that this chart illustrates a particular implementation of the invention. In this case, the audio curve shaping is based on the volume setting, which is assumed to be indicative of ambient noise conditions where the transmission is being received. As noted above, sampled ambient noise could alternatively be used to access the personality storage.

FIG. 4 details the DSP algorithm that processes messages from the microprocessor and, in particular, the DSP software that responds to the audio response message. In the same fashion as the microprocessor, the DSP has a list of background of background tasks that are performed on a regular schedule. One such task is to check for and process messages from the microprocessor. If no messages are present (no in step S201), the processor skips ahead to step S205 and the task is finished. However, if a message is present (yes in step S201), message type field is examined in step S202. Messages other than the audio response message are handled in software sections not detailed here (no step S202). When an audio response message is received (yes in step S202, the new audio response parameters are extracted from the message in step S203. In step S204, these new parameters are substituted into the DSP audio filter routines. These routines may be already in use, such as the case when the radio is receiving a call. Alternatively, if the filter routine is not currently in use, the new parameters will be used when the filter routine is next begun. The process then proceeds to step S205 and the task is finished.

As illustrated in the chart described above, as the ambient noise level increases, which is either detected by an increase in volume level or a microphone sampled ambient noise, the relative gain of the higher audio frequencies is increased at the expense of low frequency response to improve intelligibility. Of course, the "naturalness" of received speech is only compromised when necessary to enhance intelligibility, and thus, received audio will be unaltered during normal ambient noise conditions. In addition, by limiting the energy of the low frequencies, the volume of the high frequencies can be raised substantially beyond a point where distortion would normally limit usable volume.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of dynamically altering an audio response of a radio receiver, the method comprising:
   (a) determining an ambient noise level by sampling the ambient noise level using a microphone input;
   (b) determining an audio response function in accordance with the ambient noise level; and
   (c) adjusting the audio response of the radio receiver in accordance with the audio response function by sacrificing a gain of low audio frequencies in favor of a gain of high audio frequencies without regard to fidelity.

2. A method according to claim 1, wherein step (b) is practiced by accessing an array of audio parameters and selecting parameters corresponding to the sampled ambient noise level.

3. A method according to claim 1, comprising the further step of dividing a receive audio passband into at least low frequency and high frequency sub bands to define an array of audio parameters corresponding to a range of ambient noise levels.

4. A method according to claim 3, wherein step (b) is practiced by accessing the array of audio parameters and selecting parameters corresponding to the sampled ambient noise level.

5. A method according to claim 1, wherein step (c) is practiced by (d) adjusting the gain of high audio frequencies relative to the gain of low audio frequencies.

6. A method according to claim 5, wherein when the ambient noise level increases, step (d) is practiced by increasing the gain of the high audio frequencies relative to the low audio frequencies.

7. A method according to claim 1, wherein step (b) is practiced by building an audio response message in accordance with the ambient noise level.

8. A method according to claim 7, comprising the further step, prior to step (c), of sending the audio response message to a digital signal processor (DSP), wherein step (c) is carried out by the DSP.

9. A method according to claim 7, comprising the further step, prior to step (c), of extracting audio response parameters from the audio response message and substituting the audio response parameters into a digital signal processor filter routine.

10. A method according to claim 1, wherein step (b) is practiced by modifying a response of a dedicated filter circuit.

11. A method of dynamically altering an audio response of a radio receiver, the method comprising:
   (a) determining an ambient noise level by sampling the ambient noise level using a microphone input; and
   (b) adjusting a gain of high audio frequencies relative to a gain of low audio frequencies in accordance with the ambient noise level by sacrificing the gain of low audio frequencies in favor of the gain of high audio frequencies without regard to fidelity.

12. A method according to claim 11, wherein when the ambient noise level increases, step (b) is practiced by increasing the gain of the high audio frequencies relative to the low audio frequencies.

13. An apparatus for dynamically altering an audio response of a radio receiver, the apparatus comprising:
   means for determining an ambient noise level comprising a microphone input that samples the ambient noise level;
   a controller that builds an audio response message in accordance with the ambient noise level; and a digital signal processor (DSP) that adjusts the audio response of the radio receiver in accordance with the audio response message by sacrificing a gain of low audio frequencies in favor of a gain of high audio frequencies without regard to fidelity.

14. An apparatus according to claim 13, wherein said controller builds said audio response message by accessing an array of audio parameters and selecting parameters corresponding to the sampled ambient noise level.

15. An apparatus according to claim 13, wherein said controller divides a receive audio passband into at least low frequency and high frequency sub bands to define an array of audio parameters corresponding to a range of ambient noise levels.

16. An apparatus according to claim 15, wherein said controller builds said audio response message by accessing the array of audio parameters and selecting parameters corresponding to the sampled ambient noise level.

17. An apparatus according to claim 13, wherein said DSP adjusts the audio response of the radio receiver by adjusting the gain of high audio frequencies relative to the gain of low audio frequencies.

18. An apparatus according to claim 17, wherein said DSP adjusts the audio response by increasing the gain of the high audio frequencies relative to the low audio frequencies when the ambient noise level increases.

19. An apparatus according to claim 13, wherein said DSP extracts audio response parameters from the audio response message and substitutes the audio response parameters into a DSP filter routine.

20. An apparatus for dynamically altering an audio response of a radio receiver, the apparatus comprising:

means for determining an ambient noise level comprising a microphone input that samples the ambient noise level; and means for adjusting a gain of high audio frequencies relative to a gain of low audio frequencies in accordance with the ambient noise level by sacrificing the gain of low audio frequencies in favor of the gain of high audio frequencies without regard to fidelity.

21. An apparatus according to claim 20, wherein said adjusting means increases the gain of the high audio frequencies relative to the low audio frequencies when the ambient noise level increases.

* * * * *